United States Patent
Sung

(10) Patent No.: US 12,085,619 B2
(45) Date of Patent: Sep. 10, 2024

(54) METHOD FOR ESTIMATING BATTERY STATE OF CHARGE AND BATTERY MANAGEMENT SYSTEM APPLYING THE SAME

(71) Applicant: LG ENERGY SOLUTION, LTD., Seoul (KR)

(72) Inventor: Yong Chul Sung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 506 days.

(21) Appl. No.: 17/435,822

(22) PCT Filed: Sep. 5, 2020

(86) PCT No.: PCT/KR2020/013043
§ 371 (c)(1),
(2) Date: Sep. 2, 2021

(87) PCT Pub. No.: WO2021/085869
PCT Pub. Date: May 6, 2021

(65) Prior Publication Data
US 2022/0155380 A1  May 19, 2022

(30) Foreign Application Priority Data

Oct. 31, 2019  (KR) .................. 10-2019-0137548

(51) Int. Cl.
*G01R 31/3842* (2019.01)
*G01R 31/36* (2020.01)
(Continued)

(52) U.S. Cl.
CPC ..... *G01R 31/3842* (2019.01); *G01R 31/3648* (2013.01); *H01M 10/4207* (2013.01);
(Continued)

(58) Field of Classification Search
CPC ........ H02J 7/0048; H02J 7/0013; H02J 7/005; H02J 7/00712; H02J 7/00714;
(Continued)

(56) References Cited

U.S. PATENT DOCUMENTS 8,175,826 B2  5/2012  Kang et al.
8,264,203 B2  9/2012  Darilek et al.
(Continued)

FOREIGN PATENT DOCUMENTS

CN   1668933 A    9/2005
CN   102822690 A  12/2012
(Continued)

OTHER PUBLICATIONS

Extended European Search Report dated Apr. 14, 2022 issued by the European Patent Office in counterpart European Patent Application No. 20883067.9.
(Continued)

*Primary Examiner* — Binh C Tat
(74) *Attorney, Agent, or Firm* — MORGAN, LEWIS & BOCKIUS LLP

(57) ABSTRACT

The present disclosure relates to a method for estimating a state of charge (SOC) of a battery and a battery management system applying the same. A method for estimating a SOC of a battery in a method for estimating a SOC of a battery module assembly including battery modules respectively including a plurality of battery cells includes: receiving a battery current from a current sensor; comparing the battery current and a threshold current, and selecting a method for estimating a first SOC or a method for estimating a second SOC according to a comparison result; estimating a SOC of the cells according to the selected method for estimating a
(Continued)

state of charge; and estimating the SOC of the battery module assembly by combining the estimated SOC of the battery cells.

10 Claims, 6 Drawing Sheets

(51) Int. Cl.
*H01M 10/42* (2006.01)
*H01M 10/44* (2006.01)

(52) U.S. Cl.
CPC ....... *H01M 10/425* (2013.01); *H01M 10/441* (2013.01); *H01M 2010/4271* (2013.01)

(58) Field of Classification Search
CPC .. H02J 7/0069; H02J 7/0016; H02J 7/007194; H02J 2310/48; H02J 7/00034; H02J 7/0025; H02J 7/0014; H02J 7/0047; H02J 7/00; H02J 7/00032; H02J 7/00718; H02J 2207/20; H02J 7/0018; H02J 7/0036; H02J 7/00047; H02J 7/0049; H02J 7/1423; H02J 7/0024; H02J 7/0071; H02J 7/007182; H02J 7/007192; H02J 2300/24; H02J 2310/44; H02J 7/00045; H02J 7/0068; H02J 13/00002; H02J 7/00308; H02J 13/00001; H02J 2207/40; H02J 7/00309; H02J 7/007; H02J 7/1492; H02J 7/342; H02J 7/35; H02J 1/14; H02J 2300/20; H02J 2300/28; H02J 2300/30; H02J 3/32; H02J 3/381; H02J 7/0019; H02J 7/0029; H02J 7/00302; H02J 7/06; H02J 7/345; H02J 3/26; H02J 7/0031; H02J 7/0063; H02J 7/00711; H02J 7/007184; H02J 2310/64; H02J 3/14; H02J 7/00036; H02J 7/00304; H02J 7/00306; H02J 7/04; H02J 7/16; H02J 7/34; H02J 1/10; H02J 1/106; H02J 1/109; H02J 13/00022; H02J 2310/40; H02J 7/00041; H02J 7/00716; H02J 7/00719; H02J 7/163; H01M 2220/20; H01M 10/488; H01M 16/006
USPC .................................................. 320/127–136
See application file for complete search history.

(56) References Cited

U.S. PATENT DOCUMENTS

| | | | |
|---|---|---|---|
| 8,639,460 | B2 | 1/2014 | Kang et al. |
| 9,261,564 | B2 | 2/2016 | Okada et al. |
| 10,250,055 | B2 | 4/2019 | Park et al. |
| 2005/0269991 | A1 | 12/2005 | Mitsui et al. |
| 2010/0174499 | A1 | 7/2010 | Kang et al. |
| 2011/0248677 | A1 | 10/2011 | Shimizu |
| 2012/0150503 | A1 | 6/2012 | Haupt et al. |
| 2012/0326726 | A1 | 12/2012 | Tabuchi et al. |
| 2013/0076365 | A1 | 3/2013 | Okada et al. |
| 2013/0110430 | A1 | 5/2013 | Nishi et al. |
| 2013/0144547 | A1 | 6/2013 | Yun et al. |
| 2014/0167656 | A1 | 6/2014 | Yamada |
| 2014/0361743 | A1* | 12/2014 | Lin .......................... B60L 58/15 320/109 |
| 2015/0268309 | A1 | 9/2015 | Kim |
| 2015/0311736 | A1 | 10/2015 | Park et al. |
| 2017/0045587 | A1* | 2/2017 | Kim .................... H01M 10/482 |
| 2017/0082693 | A1* | 3/2017 | Leidich .............. G01R 31/3835 |
| 2020/0033420 | A1 | 1/2020 | Kim |

FOREIGN PATENT DOCUMENTS

| | | | |
|---|---|---|---|
| CN | 104569827 | A | 4/2015 |
| JP | H08-29505 | A | 2/1996 |
| JP | 2011-221012 | A | 11/2011 |
| JP | 2011-223722 | A | 11/2011 |
| JP | 2012-133757 | A | 7/2012 |
| JP | 2013-96770 | A | 5/2013 |
| JP | 2013-130504 | A | 7/2013 |
| JP | 5521795 | B2 | 6/2014 |
| JP | 2016-102674 | A | 6/2016 |
| KR | 10-2009-0020470 | A | 2/2009 |
| KR | 10-2015-0019190 | A | 2/2015 |
| KR | 10-2015-0048439 | A | 5/2015 |
| KR | 10-2015-0124233 | A | 11/2015 |
| KR | 10-2016-0014165 | A | 2/2016 |
| KR | 10-2017-0020072 | A | 2/2017 |
| KR | 10-2019-0049272 | A | 5/2019 |
| WO | 2011/118039 | A1 | 9/2011 |
| WO | 2013/031559 | A1 | 3/2013 |

OTHER PUBLICATIONS

International Search Report (with partial translation) and Written Opinion issued in corresponding International Patent Application No. PCT/KR2020/013043, dated Jan. 13, 2021.

Office Action dated Sep. 13, 2022 issued by the Japanese Patent Office in corresponding Japanese Patent Application No. 2021-545812.

Office Action dated Sep. 13, 2023, issued in corresponding Chinese Patent Application No. 202080019887.2. (Note: JP 2016-102674 A, US 2017/0045587 A1, and CN 103620432 A cited therein are cited in earlier filed IDSs).

* cited by examiner

FIG. 5

|  | Tn-1 | | Tn | | |
|---|---|---|---|---|---|
|  | Cell voltage (V) | SOC (%) | Cell voltage (V) | SOC deviation | SOC (%) |
| Cell_x1 | 3.62 | 34 | 3.6 | - | 33 |
| Cell_x2 | 3.65 | 35 | 3.62 | - | 34 |
| Cell_x3 | 3.65 | 35 | 3.62 | - | 34 |
| Cell_x4 | 3.67 | 36 | 3.65 | - | 35 |
| ... | ... | ... | ... | ... | ... |
| Cell_xn | 3.62 | 34 | 3.6 |  | 33 |
| Representative value | 3.65 | 35 | 3.62 | 34 (-1) | 34 |

METHOD FOR ESTIMATING BATTERY STATE OF CHARGE AND BATTERY MANAGEMENT SYSTEM APPLYING THE SAME

TECHNICAL FIELD

This application claims priority to and the benefit of Korean Patent Application No. 10-2019-0137548 filed in the Korean Intellectual Property Office on Oct. 31, 2019, the entire contents of which are incorporated herein by reference.

The present invention relates to a method for estimating a state of charge of a battery and a battery management system applying the same.

BACKGROUND ART

In recent years, electric vehicles such as a hybrid electric vehicle (HEV) or a pure water electric vehicle (PEV) have gained high attention. The electric vehicle includes a battery for driving an electric motor and driving the vehicle. Further, the electric vehicle includes a regenerative brake system, and braking power may be converted into useful electrical energy for charging the battery through the regenerative brake system. Therefore, the battery included in the electric vehicle may frequently cause transition of a state of charge and a state of discharge.

On the other hand, when the battery is connected to a load and a discharging starts, a terminal voltage is gradually reduced, and when the terminal voltage reaches a termination voltage, discharging performance may be lost. When the terminal voltage is discharged to be less than the termination voltage, a lifespan of the battery may be reduced or a function may be lost.

Therefore, an important parameter of the electric vehicle using a battery is a state of charge (SOC) of the battery. When the state of charge (SOC) of the battery is accurately known, problems such that the electric vehicle abruptly stops may be prevented in advance, and power may be stably supplied to the driving motor of the electric vehicle.

A Coulomb counting method and an impedance measuring method are used as methods for calculating a SOC of a battery cell. The Coulomb counting method is a method for counting an amount of a discharged current (a current flowing to the load) and estimating a SOC of the battery according to the amount of a discharged current. However, the Coulomb counting method has a problem that a measuring error generated by the process for measuring a current is accumulated with respect to time and the accuracy of estimating the SOC is lowered. The impedance measuring method is a method for measuring an open circuit voltage (OCV) of the battery cell, mapping the measured OCV on a lookup table, and estimating the SOC of the battery cell.

In another way, the entire SOC may be calculated by combining the SOC of a plurality of respective battery cells in the battery system including a plurality of battery cells. In this case, as a number of the battery cells increases, the time of calculating the entire SOC increases, and the use of capacity of the memory increases.

DISCLOSURE

The present invention has been made in an effort to provide a method for reducing a time of estimating a state of charge (SOC) of a battery and a memory space in a battery system including a plurality of battery modules respectively including a plurality of battery cells, and a battery management system applying the method.

An embodiment of the present invention provides a method for estimating a state of charge (SOC) of a battery in a method for estimating a SOC of a battery module assembly including battery modules respectively including a plurality of battery cells, including: receiving a battery current from a current sensor; comparing the battery current and a threshold current, and selecting a method for estimating a first state of charge or a method for estimating a second state of charge according to a comparison result; estimating a SOC of the cells according to the selected method for estimating a state of charge; and estimating the SOC of the battery module assembly by combining the estimated SOC of the battery cells.

The selecting of a method for estimating a first state of charge or a method for estimating a second state of charge may include selecting the method for estimating a first state of charge when the battery current is equal to or less than the threshold current, and selecting the method for estimating a second state of charge when the battery current is greater than the threshold current.

The estimating of a SOC of the cells may include: estimating the SOC for each the battery module according to the method for estimating a first state of charge; and estimating the SOC of the cells based on a SOC deviation between the SOC corresponding to the respective representative values of the battery module distinguished by discretization according to the method for estimating a second state of charge.

The estimating of the SOC according to the method for estimating a first state of charge may include: estimating the SOC of a plurality of battery cells configuring a selected battery module; and estimating a current SOC of a plurality of battery cells configuring a non-selected battery module by substituting the current SOC with a previous SOC.

The estimating of the SOC according to the method for estimating a second state of charge may include estimating a current SOC of a plurality of battery cells configuring the battery module by adding the SOC deviation to a previous SOC of the cells.

The SOC deviation may be a deviation between the current SOC estimated corresponding to the representative value and the previous SOC.

Another embodiment of the present invention provides a battery management system for estimating a state of charge (SOC) of a battery module assembly including a plurality of battery modules respectively including a plurality of battery cells, including: a cell monitoring IC connected to respective ends of the respective cells and measuring cell voltages of the cells; and a main control circuit for estimating the SOC of the battery module assembly by estimating and combining the SOC of the cells based on the measured cell voltage, wherein the main control circuit receives a battery current from a current sensor, compares the battery current and a threshold current, selects a method for estimating a first state of charge or a method for estimating a second state of charge according to a comparison result, and estimates the SOC of the cells according to the selected method.

The main control circuit may select the method for estimating a first state of charge for estimating the SOC for each the battery module when the battery current is equal to or less than the threshold current, and the main control circuit may select the method for estimating a second state of charge for estimating the SOC of the cells based on a SOC deviation between the SOC corresponding to the respective representative values of the battery module distinguished by discretization when the battery current is greater than the threshold current.

The main control circuit may estimate a SOC of a plurality of battery cells configuring a selected battery module according to the method for estimating a first state of charge, and may substitute a current SOC of a plurality of battery cells configuring a non-selected battery module with a previous SOC.

The main control circuit may estimate a current SOC of a plurality of battery cells configuring the battery module by adding the SOC deviation to a previous SOC of the cells according to the method for estimating a second state of charge.

The SOC deviation may be a deviation between the current SOC estimated corresponding to the representative value and the previous SOC.

The present disclosure may save the time of estimating a state of charge (SOC) of a battery and the memory space in the battery system including a plurality of battery modules respectively including a plurality of battery cells.

The present disclosure may estimate the state of charge of the entire battery cells installed in the battery module when the number of battery modules installed in the battery system increases.

DESCRIPTION OF THE DRAWINGS

FIG. 5 shows a schematic view of a method for estimating a second state of charge according to an embodiment.

MODE FOR INVENTION

Figure 1:
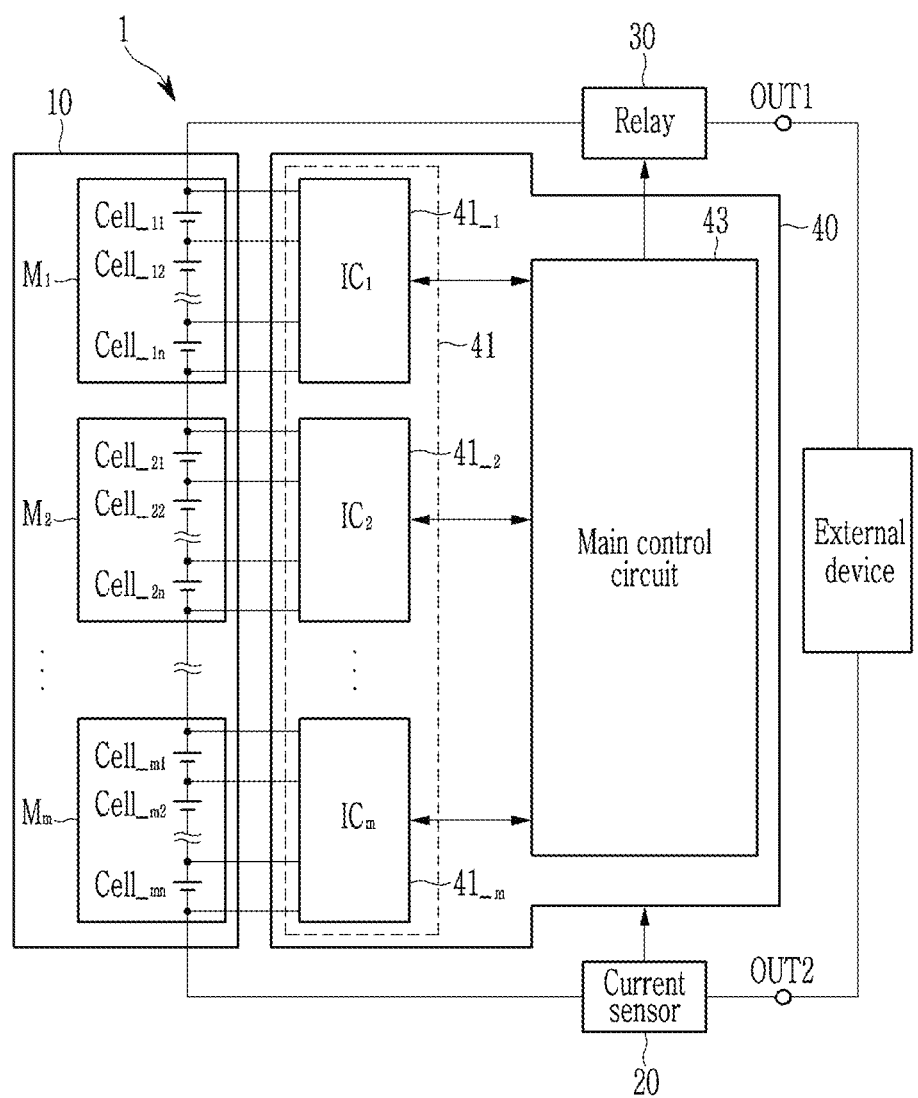
FIG. 1 shows a battery system according to an embodiment.

Hereinafter, embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to make the specification easier, and hence, these terms do not have meanings or roles that distinguish them from each other by themselves. In describing embodiments of the present specification, when it is determined that a detailed description of the well-known art associated with the present invention may obscure the gist of the present invention, it will be omitted. The accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like, will be used only to describe various components, and are not interpreted as limiting these components. The terms are only used to differentiate one component from other components.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected to or coupled to another component without the other component intervening therebetween.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

Figure 2:
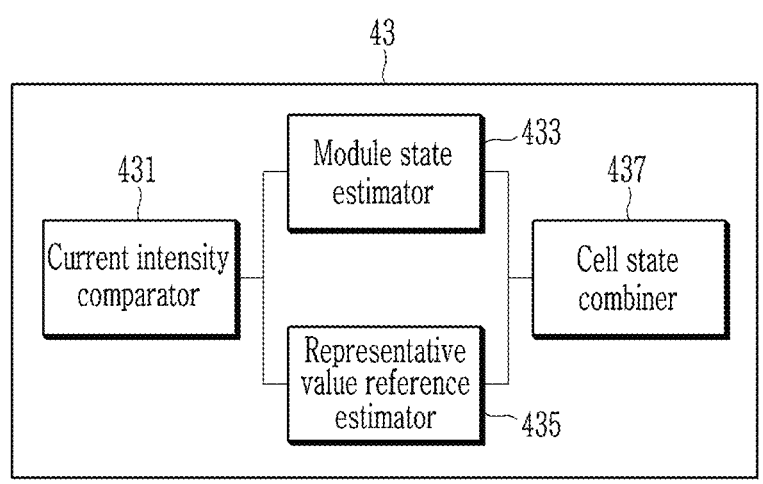
FIG. 2 shows a function of a main control circuit described with reference to FIG. 1.
Figure 3:
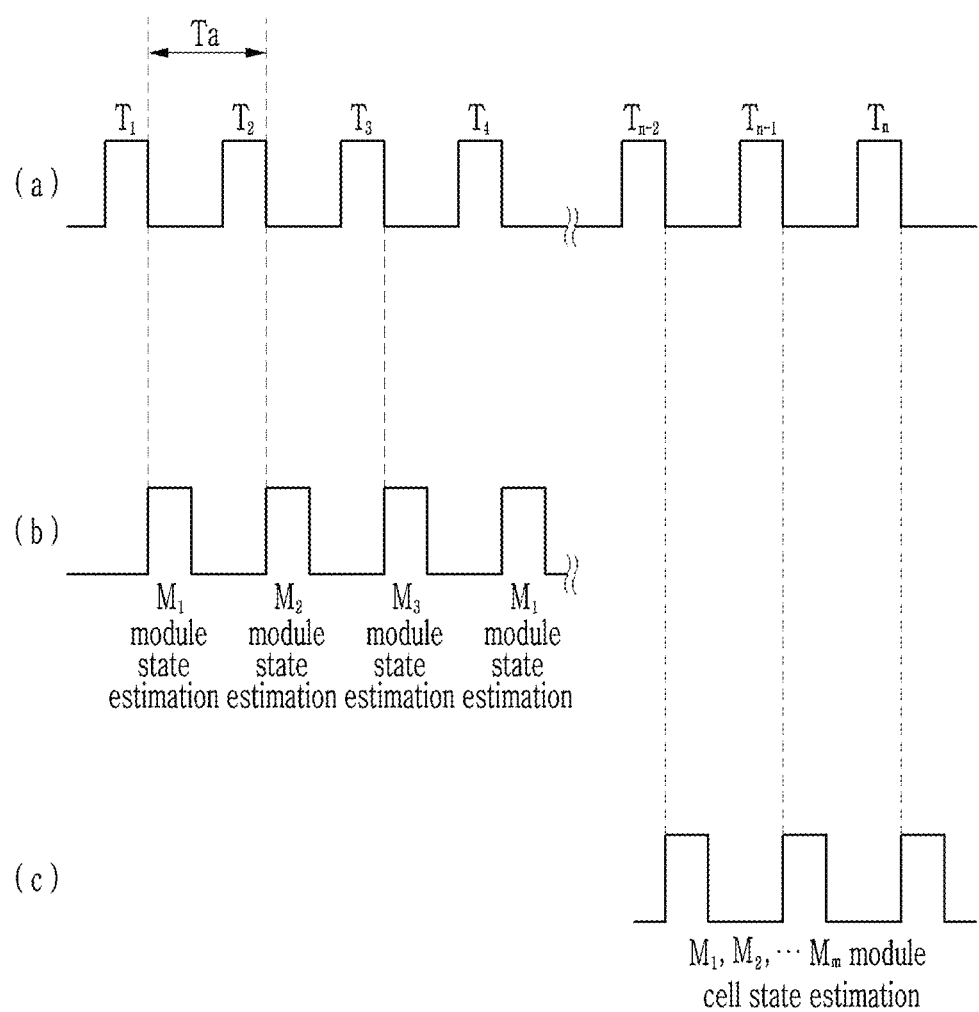
FIG. 3 shows a timing diagram of a method for estimating first or second states of charge based on a battery current measurement and a measured battery current according to an embodiment.
Figure 4:
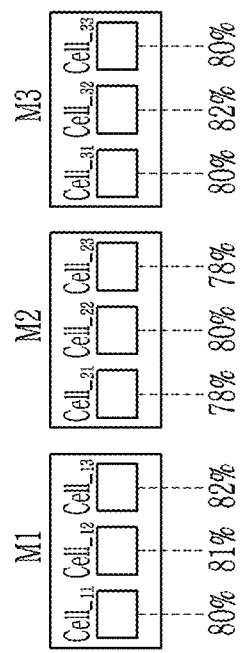
FIG. 4 shows a schematic view of a method for estimating a first state of charge according to an embodiment.

FIG. 1 shows a battery system according to an embodiment, FIG. 2 shows a function of a main control circuit described with reference to FIG. 1, FIG. 3 shows a timing diagram of a method for estimating first or second states of charge based on a battery current measurement and a measured battery current according to an embodiment, FIG. 4 shows a schematic view of a method for estimating a first state of charge according to an embodiment, and FIG. 5 shows a schematic view of a method for estimating a second state of charge according to an embodiment.

As shown in FIG. 1, the battery system 1 includes a battery module assembly 10, a current sensor 20, a relay 30, and a BMS 40.

The battery module assembly 10 includes a plurality of battery modules (M1, M2, . . . , Mm) connected in series/parallel and it may supply a power voltage to be used by an external device. In FIG. 1, the battery module assembly 10 is connected between two output ends OUT1 and OUT2 of the battery system 1, the relay 30 is connected between a positive electrode of the battery system 1 and the output end OUT1, and the current sensor 20 is connected between a negative electrode of the battery system 1 and the output end OUT2.

For example, the battery module assembly 10 may include a plurality of battery modules (M1, M2, . . . , Mm) coupled in series, and the battery modules ($M_x$) may respectively include a plurality of battery cells ($Cell_{x1}$, $Cell_{x2}$, . . . , $Cell_{xn}$) coupled in series. Configurations and a connection relationship among them described with reference to FIG. 1 are only examples, and the present disclosure is not limited thereto. X is one of the natural numbers of 1 to m.

The current sensor 20 is connected in series to a current path between the battery module assembly 10 and an external device. The current sensor 20 may measure a current flowing to the battery module assembly 10, that is, a charging current and a discharging current (hereinafter, a battery current), and may transmit a measurement result to the BMS 40. In detail, the current sensor 20 may measure the battery current for each predetermined period (Ta) and may transmit it to the BMS 40.

The relay 30 controls an electrical connection between the battery system 1 and the external device. When the relay 30 is turned on, the battery system 1 is electrically connected to the external device to perform charging or discharging, and when the relay 30 is turned off, the battery system 1 is electrically disconnected from the external device. The external device may be a load or a charger.

The BMS 40 may include a cell monitoring IC 41 and a main control circuit 43.

The cell monitoring IC 41 is electrically connected to a positive electrode and a negative electrode of a plurality of respective battery cells (Cell_x1, Cell_x2, . . . , Cell_xn), and measures an open circuit voltage (OCV) (hereinafter, a cell voltage). In FIG. 1, the cell monitoring IC 41 includes a plurality of cell monitoring ICs (41_1, 41_2, . . . , 41_m) corresponding to a plurality of battery modules (M1, M2, . . . , Mm) and measures cell voltages of a plurality of battery cells (Cell_x1, Cell_x2, . . . , Cell_xn), and without being limited to this, it may be configured in various forms for measuring the cell voltages of a plurality of battery cells (Cell_x1, Cell_x2, . . . , Cell_xn).

The cell monitoring IC 41 transmits the cell voltages of a plurality of battery cells (Cell_x1, Cell_x2, . . . , Cell_xn) to the main control circuit 43. For example, the cell monitoring IC 41 measures cell voltages of a plurality of battery cells (Cell_x1, Cell_x2, . . . , Cell_xn) for each predetermined period (Ta), and transmits a plurality of measured cell voltages to the main control circuit 43.

Referring to FIG. 2, the main control circuit 43 may include a current intensity comparator 431, a module state estimator 433, a representative value reference estimator 435, and a cell state combiner 437.

Referring to FIG. 1 and FIG. 3(*a*), the main control circuit 43 receives the battery current (Ib) measured by the current sensor 20 and a plurality of cell voltages (hereinafter, SOC parameters) measured by the cell monitoring IC 41. The SOC parameters may be repeatedly measured and received for respective times (T1, T2, . . . , Tn) at regular intervals of a predetermined period (Ta).

The current intensity comparator 431 may compare the battery current (Ib) received from the current sensor 20 and a threshold current (It), and may select a method for estimating a first state of charge or a method for estimating a second state of charge according to the comparison result.

FIG. 3 illustrates that the method for estimating a first state of charge is selected for the estimation times T1, T2, T3, and T4, and the method for estimating a second state of charge is selected for the estimation times Tn-2, Tn-1, and Tn, which is however not limited thereto. For example, the current intensity comparator 431 may repeatedly compare the current for respective times (T1, T2, . . . , Tn) at regular intervals of a predetermined period (Ta), and may select a method for estimating a first state of charge or a method for estimating a second state of charge according to the comparison result.

In detail, when the battery current (Ib) is less than the threshold current (It), the current intensity comparator 431 determines as that a change ($\Delta$SOC) of the state of charge (SOC) of a plurality of battery cells (Cell_x1, Cell_x2, . . . , Cell_xn) is small, and may select the method for estimating a first state of charge. When the battery current (Ib) is greater than the threshold current (It) according to the comparison result, the current intensity comparator 431 may determine that the change ($\Delta$SOC) of the state of charge of a plurality of battery cells (Cell_x1, Cell_x2, . . . , Cell_xn) is big, and may select the method for estimating a second state of charge.

The module state estimator 433 may estimate and substitute the SOC of a plurality of battery cells (Cell_x1, Cell_x2, . . . , Cell_xn) for the respective battery modules ($M_x$) according to the method for estimating a first state of charge. Hereinafter, the SOC estimated for a previous estimation time will be defined to be a previous SOC, and the SOC estimated for a current estimation time will be defined to be a current SOC.

In detail, the module state estimator 433 may select one battery module ($M_x$) from among a plurality of battery modules (M1, M2, . . . , Mm), and may estimate the SOC of the cell voltages of a plurality of battery cells (Cell_x1, Cell_x2, . . . , Cell_xn) configuring the selected battery module ($M_x$) based on a lookup table (not shown). The module state estimator 433 may reduce a SOC operation process by substituting the current SOC of a plurality of battery cells (Cell_x1, Cell_x2, . . . , Cell_xn) configuring the battery module ($M_x$) that is not selected with the previous SOC and estimating the SOC.

Referring to FIG. 3(*b*) and FIG. 4, the module state estimator 433 may select the battery module ($M_x$) for the respective times T1, T2, T3, and T4 at the interval of a predetermined period (Ta), and may estimate the SOC of a plurality of battery cells (Cell_x1, Cell_x2, and Cell_x3) configuring the selected battery module ($M_x$) based on the cell voltage. The module state estimator 433 may estimate the SOC by substituting the current SOC of a plurality of battery cells (Cell_x1, Cell_x2, and Cell_x3) configuring the battery module ($M_x$) that is not selected for the times T1, T2, T3, and T4 with the previous SOC.

For example, for the time T1, the module state estimator 433 may estimate the SOC (78%, 80%, and 79%) of the cell voltages of a plurality of battery cells ($Cell_{-11}$, $Cell_{-12}$, and $Cell_{-13}$) configuring the first battery module M1 based on the lookup table. In this instance, the module state estimator 433 may estimate the previous SOC (78%, 80%, and 78%) of a plurality of battery cells ($Cell_{-21}$, $Cell_{-22}$, and $Cell_{-23}$) configuring the second battery module M2 and the previous SOC (80%, 82%, and 80%) of a plurality of battery cells ($Cell_{-31}$, $Cell_{-32}$, and $Cell_{-33}$) configuring the third battery module M3 as the current SOC (78%, 80%, and 78%) and the current SOC (80%, 82%, and 80%).

The representative value reference estimator 435 may estimate the respective SOC of a plurality of battery cells (Cell_x1, Cell_x2, . . . , Cell_xn) according to the method for estimating a second state of charge. In detail, the representative value reference estimator 435 calculates a representative value based on the cell voltages of a plurality of battery cells (Cell_x1, Cell_x2, . . . , Cell_xn) included in the respective battery modules ($M_x$), estimates the SOC corresponding to the calculated representative value, and calculates a SOC deviation between the estimated current SOC and the previous SOC.

The representative value reference estimator 435 may estimate the current SOC of a plurality of battery cells (Cell_x1, Cell_x2, . . . , Cell_xn) by adding the calculated SOC deviation to the previous SOC of a plurality of respective battery cells (Cell_x1, Cell_x2, . . . , Cell_xn) configuring the respective battery modules ($M_x$). The representative value may be set with the cell voltage of a median value from among cell voltages of a plurality of battery cells (Cell_x1, Cell_x2, . . . , Cell_xn) configuring the battery module ($M_x$), and a mean voltage ($V_m$) of the cell voltages of a plurality of battery cells (Cell_x1, Cell_x2, . . . , Cell_xn), but it is not limited thereto.

Referring to FIG. 3(*c*), the representative value reference estimator 435 may calculate a representative value of a plurality of respective battery modules (M1, M2, . . . , Mm) for the times Tn-2, Tn-1, and Tn at the interval of a predetermined period (Ta), may calculate a SOC deviation corresponding to the calculated representative value, and may estimate the current SOC of a plurality of battery cells (Cell_x1, Cell_x2, ..., Cell_xn) included in the respective battery modules ($M_x$) based on the calculated SOC deviation.

Referring to FIG. 5, the representative value reference estimator 435 calculates the SOC deviation at −1% between the SOC 34% corresponding to the representative value at the current Tn and the SOC 35% corresponding to the representative value at the previous Tn-1, and may estimate the current SOC (33%, 34%, 34%, 35%, ..., 33%, 34%) by adding the calculated −1% to the previous SOC 34%, 35%, 35%, 36%, ..., 34%, 35% of a plurality of battery cells (Cell_x1, Cell_x2, ..., Cell_xn).

The cell state combiner 437 may estimate the entire SOC of the battery module assembly 10 by combining the estimated and substituted SOC of a plurality of battery cells (Cell_x1, Cell_x2, ..., Cell_xn) configuring the battery module ($M_x$). For example, referring to FIG. 3 and FIG. 4, the cell state combiner 437 may estimate the entire SOC of the battery module assembly 10 by repeatedly combining the estimated SOC of a plurality of battery cells (Cell_x1, Cell_x2, ..., Cell_xn) for the respective times (T1, T2, ..., Tn) at the interval of a predetermined period (Ta).

Figure 6:
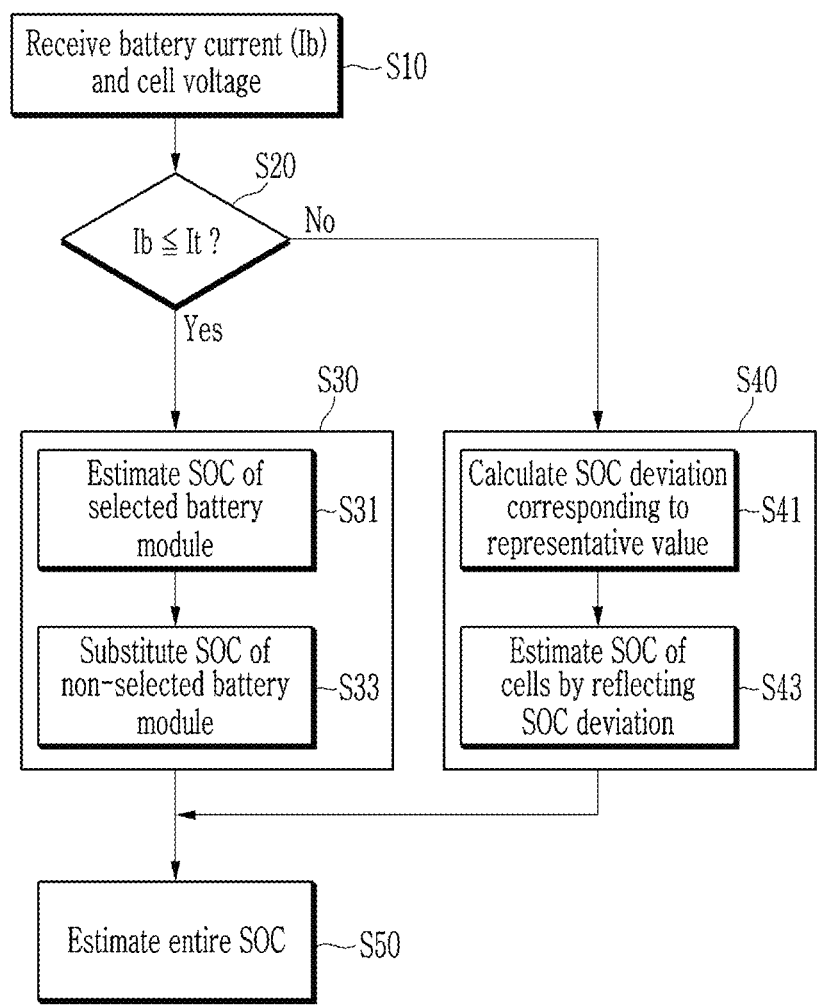
FIG. 6 shows a flowchart of a method for estimating a state of charge of a battery according to an embodiment.

FIG. 6 shows a flowchart of a method for estimating a state of charge of a battery according to an embodiment.

First, the main control circuit 43 receives a battery current (Ib) from the current sensor 20, and a plurality of cell voltages of a plurality of battery cells (Cell_x1, Cell_x2, ..., Cell_xn) from the cell monitoring IC 41 (S10). Referring to FIG. 3, the main control circuit 43 may repeatedly receive the battery current (Ib) and a plurality of cell voltages for the times (T1, T2, ..., Tn) at the interval of a predetermined period (Ta).

The main control circuit 43 compares the received battery current (Ib) and the threshold current (It) and selects the method for estimating a first state of charge or the method for estimating a second state of charge according to the comparison result (S20).

For example, when the battery current (Ib) is less than the threshold current (It), the main control circuit 43 determines that the change (ΔSOC) of the states of charge (SOC) of a plurality of battery cells (Cell_x1, Cell_x2, ..., Cell_xn) is small, and it may select the method for estimating a first state of charge. When the battery current (Ib) is greater than the threshold current (It), the main control circuit 43 determines that the change (ΔSOC) of the states of charge of a plurality of battery cells (Cell_x1, Cell_x2, ..., Cell_xn) is big, and it may select the method for estimating a second state of charge.

The main control circuit 43 estimates the SOC of a plurality of battery cells (Cell_x1, Cell_x2, ..., Cell_xn) according to the selected method for estimating a state of charge. In detail, the main control circuit 43 may estimate and substitute the SOC for each battery module ($M_x$) according to the method for estimating a first state of charge (S30), or may estimate the SOC of a plurality of battery cells (Cell_x1, Cell_x2, ..., Cell_xn) configuring the battery module ($M_x$) based on the SOC deviation among the SOC corresponding to the respective representative values of the battery module distinguished by discretization according to the method for estimating a second state of charge (S40).

In S30, the main control circuit 43 selects one battery module ($M_x$) from among a plurality of battery modules (M1, M2, ..., Mm), and may estimate the SOC of a plurality of battery cells (Cell_x1, Cell_x2, ..., Cell_xn) configuring the selected battery module ($M_x$) by comparing the cell voltage and a lookup table (S31).

In S30, the main control circuit 43 may reduce a SOC operation process by substituting the current SOC of a plurality of battery cells (Cell_x1, Cell_x2, ..., Cell_xn) configuring the battery module ($M_x$) that is not selected with the previous SOC and estimating the SOC (S33).

For example, referring to FIG. 3(b) and FIG. 4, the main control circuit 43 may select the battery module ($M_x$) for the respective times T1, T2, T3, and T4 at the interval of a predetermined period (Ta), and may operate the SOC of a plurality of battery cells (Cell_x1, Cell_x2, and Cell_x3) configuring the selected battery module ($M_x$) based on the cell voltage. The main control circuit 43 may estimate the SOC by substituting the current SOC of a plurality of battery cells (Cell_x1, Cell_x2, and Cell_x3) configuring the battery module ($M_x$) that is not selected for the times T1, T2, T3, and T4 with the previous SOC.

For example, for the time T1, the main control circuit 43 may estimate the SOC (78%, 80%, and 79%) of the cell voltages of a plurality of battery cells ($Cell_{11}$, $Cell_{12}$, and $Cell_{13}$) configuring the first battery module M1 based on the lookup table. In this instance, the main control circuit 43 may estimate the previous SOC (78%, 80%, and 78%) of a plurality of battery cells ($Cell_{21}$, $Cell_{22}$, and $Cell_{23}$) configuring the second battery module M2 and the previous SOC (80%, 82%, and 80%) of a plurality of battery cells ($Cell_{31}$, $Cell_{32}$, and $Cell_{33}$) configuring the third battery module M3 as the current SOC (78%, 80%, and 78%) and the current SOC (80%, 82%, and 80%) at the time T1.

In S40, the main control circuit 43 may calculate a representative value based on the cell voltages of a plurality of battery cells (Cell_x1, Cell_x2, and Cell_x3) included in the respective battery modules ($M_x$), may estimate the SOC corresponding to the calculated representative value, and may calculate a SOC deviation between the estimated current SOC and the previous SOC. The representative value may be set with the cell voltage of a median value from among cell voltages of a plurality of battery cells (Cell_x1, Cell_x2, ..., Cell_xn) configuring the battery module ($M_x$), and a mean voltage ($V_m$) of the cell voltages of a plurality of battery cells (Cell_x1, Cell_x2, ..., Cell_xn), but it is not limited thereto.

In S40, the main control circuit 43 may estimate the current SOC by respectively adding the calculated SOC deviation to the previous SOC of a plurality of battery cells (Cell_x1, Cell_x2, ..., Cell_xn) (S43).

For example, referring to FIG. 5, the main control circuit 43 may estimate the current SOC (33%, 34%, 34%, 35%, ..., 33%, 34%) by calculating the SOC deviation of −1% between the SOC 34% corresponding to the representative value at the current Tn and the SOC 35% corresponding to the representative value at the previous Tn-1, and respectively adding the calculated −1% to the previous SOC 34%, 35%, 35%, 36%, ..., 34%, 35% of a plurality of battery cells (Cell_x1, Cell_x2, ..., Cell_xn).

The main control circuit 43 may estimate the entire SOC of the battery module assembly 10 by combining the estimated and substituted SOC of a plurality of battery cells (Cell_x1, Cell_x2, ..., Cell_xn) configuring the battery module ($M_x$) (S50).

For example, referring to FIG. 3 and FIG. 4, the main control circuit 43 may estimate the entire SOC of the battery module assembly 10 by repeatedly combining the estimated and substituted SOC of a plurality of battery cells (Cell_x1, Cell_x2, ..., Cell_xn) for respective times (T1, T2, ..., Tn) at the interval of a predetermined period (Ta).

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

The invention claimed is:

1. A method for estimating a state of charge (SOC) of a battery module assembly including a plurality of battery modules respectively including a plurality of battery cells, the method comprising:
receiving a battery current from a current sensor, the battery current being an amount of current flowing to or from the battery module assembly;
comparing the battery current and a threshold current;
selecting one of a first method for estimating a state of charge and a second method for estimating a state of charge, according to a result of the comparing, the second method being different from the first method;
estimating a current SOC of the battery cells according to the selected one of the first method and the second method for estimating a state of charge; and
estimating the SOC of the battery module assembly by combining the estimated current SOC of the battery cells,
wherein the estimating of the current SOC of the battery cells includes:
if the battery current is less than or equal to the threshold current, estimating the current SOC for the battery cells based on current cell voltages or a previous SOC of a plurality of battery cells respectively in each battery module, among the plurality of battery modules, according to the first method for estimating a state of charge; and
if the battery current is greater than the threshold current, estimating the current SOC of the battery cells based on a SOC deviation from a representative previous SOC value respectively of each battery module, among the plurality of battery modules, according to the second method for estimating a state of charge.

2. The method of claim 1, wherein the estimating of the SOC of the battery cells according to the first method for estimating a state of charge includes:
estimating a current SOC of a plurality of battery cells configuring a selected battery module, among the plurality of battery modules, based on respective current cell voltages of the battery cells configuring the selected battery module; and
estimating a current SOC of a plurality of battery cells configuring a non-selected battery module, among the plurality of battery modules, to be equal to a previous SOC of the battery cells configuring the non-selected battery module.

3. The method of claim 1, wherein the estimating of the SOC of the battery cells according to the second method for estimating a state of charge includes:
estimating the current SOC of a plurality of battery cells configuring a battery module, among the plurality of battery modules, by adding the respective SOC deviation to a previous SOC of the battery cells configuring the battery module.

4. The method of claim 1, wherein the respective SOC deviation is a deviation between a representative current SOC value and the representative previous SOC value of the battery module.

5. The method of claim 4, wherein the estimating of the SOC of the battery cells according to the second method for estimating a state of charge includes:
determining the representative current SOC value based on a median cell voltage among the current cell voltages or a mean cell voltage of the current cell voltages for the battery cells configuring the battery module; and
determining the representative previous SOC value based on a median cell voltage among corresponding previous cell voltages or a mean cell voltage of the corresponding previous cell voltages for the battery cells configuring the battery module.

6. A battery management system for estimating a state of charge (SOC) of a battery module assembly including a plurality of battery modules respectively including a plurality of battery cells, comprising:
a cell monitoring IC connected to respective ends of the respective battery cells, the cell monitoring IC being configured to measure cell voltages of the battery cells; and
a main control circuit configured to:
receive a battery current from a current sensor, the battery current being an amount of current flowing to or from the battery module assembly;
compare the battery current and a threshold current;
select one of a first method for estimating a state of charge and a second method for estimating a state of charge, according to a comparison result, the second method being different from the first method; and
estimate a current SOC of the battery cells according to the selected one of the first method and the second method; and
estimate the SOC of the battery module assembly by combining the estimated current SOC of the battery cells,
wherein the main control circuit is further configured to:
if the battery current is less than or equal to the threshold current, select the first method for estimating a state of charge and estimate the current SOC for the battery cells based on current cell voltages or a previous SOC of a plurality of battery cells respectively in each battery module, among the plurality of battery modules; and
if the battery current is greater than the threshold current, select the second method for estimating a state of charge and estimate the current SOC of the battery cells based on a SOC deviation from a representative previous SOC value respectively for each battery module, among the plurality of battery modules.

7. The battery management system of claim 6, wherein the main control circuit is further configured, with the first method selected, to:
estimate a current SOC of a plurality of battery cells configuring a selected battery module, among the plurality of battery modules, based on the respective current cell voltages of the battery cells configuring the selected battery module; and
estimate a current SOC of a plurality of battery cells configuring a non-selected battery module, among the plurality of battery modules, to be equal to a previous SOC of the battery cells configuring the non-selected battery module.

8. The battery management system of claim 6, wherein the main control circuit is further configured, with the second method selected, to estimate the current SOC of a plurality of battery cells configuring a battery module, among the plurality of battery modules, by adding the respective SOC deviation to a previous SOC of the battery cells configuring the battery module.

9. The battery management system of claim 8, wherein the respective SOC deviation is a deviation between a representative current SOC value and the representative previous SOC value of the battery module.

10. The battery management system of claim 9, wherein:
- the representative current SOC value is determined based on a median cell voltage among the current cell voltages or a mean cell voltage of the current cell voltages for the battery cells configuring the battery module; and
- the representative previous SOC value is determined based on a median cell voltage among corresponding previous cell voltages or a mean cell voltage of the corresponding previous cell voltages for the battery cells configuring the battery module.

\* \* \* \* \*

UNITED STATES PATENT AND TRADEMARK OFFICE
CERTIFICATE OF CORRECTION

| | | |
|---|---|---|
| PATENT NO. | : 12,085,619 B2 | Page 1 of 1 |
| APPLICATION NO. | : 17/435822 | |
| DATED | : September 10, 2024 | |
| INVENTOR(S) | : Yong Chul Sung | |

It is certified that error appears in the above-identified patent and that said Letters Patent is hereby corrected as shown below:

On the Title Page

Column 1, item (22) should read:
--(22) PCT Filed: Sep. 25, 2020--

Signed and Sealed this
Fourteenth Day of January, 2025

Derrick Brent
*Acting Director of the United States Patent and Trademark Office*